US010960466B2

(12) United States Patent
DeMuth et al.

(10) Patent No.: US 10,960,466 B2
(45) Date of Patent: Mar. 30, 2021

(54) POLARIZATION COMBINING SYSTEM IN ADDITIVE MANUFACTURING

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: SEURAT TECHNOLOGIES, INC., Mountain View, CA (US)

( * ) Notice: Subject to any disclaimer, the term of this patent is extended or adjusted under 35 U.S.C. 154(b) by 0 days.

(21) Appl. No.: 15/337,507

(22) Filed: Oct. 28, 2016

(65) Prior Publication Data

US 2017/0123222 A1 May 4, 2017

Related U.S. Application Data

(60) Provisional application No. 62/248,758, filed on Oct. 30, 2015, provisional application No. 62/248,765,
(Continued)

(51) Int. Cl.
*G02F 1/01* (2006.01)
*B22F 3/105* (2006.01)
(Continued)

(52) U.S. Cl.
CPC .............. *B22F 3/1055* (2013.01); *B22F 3/24* (2013.01); *B23K 15/002* (2013.01);
(Continued)

(58) Field of Classification Search
CPC . H01S 3/23; H01S 5/40; H01S 3/0071; H01S 3/0085; H01S 3/2383;
(Continued)

(56) References Cited

U.S. PATENT DOCUMENTS 4,247,508 A 1/1981 Housholder
4,944,817 A 7/1990 Bourell
(Continued)

FOREIGN PATENT DOCUMENTS

CN 1593817 A 3/2005
DE 102013000511 A1 7/2014
(Continued)

OTHER PUBLICATIONS

Peeyush Nandwana, Recyclability Study on Inconel 718 and Ti-6AI-4V Powders for Use in Electron Beam Melting, The Minerals, Metals & Materials Society and ASM International 2015, vol. 47B, Feb. 2016.

*Primary Examiner* — Euncha P Cherry
(74) *Attorney, Agent, or Firm* — David R. Stevens; Stevens Law Group

(57) ABSTRACT

A method and an apparatus pertaining to polarization combining in additive manufacturing may involve emitting two or more beams of light with a first intensity. Each of the two or more beams of light may be polarized and may have a majority polarization state and a minority polarization state. A respective polarization pattern may be applied on the majority polarization state of each of the two or more beams of light. The two or more beams of light may be combined to provide a single beam of light.

18 Claims, 12 Drawing Sheets

Related U.S. Application Data filed on Oct. 30, 2015, provisional application No. 62/248,770, filed on Oct. 30, 2015, provisional application No. 62/248,776, filed on Oct. 30, 2015, provisional application No. 62/248,783, filed on Oct. 30, 2015, provisional application No. 62/248,791, filed on Oct. 30, 2015, provisional application No. 62/248,799, filed on Oct. 30, 2015, provisional application No. 62/248,966, filed on Oct. 30, 2015, provisional application No. 62/248,968, filed on Oct. 30, 2015, provisional application No. 62/248,969, filed on Oct. 30, 2015, provisional application No. 62/248,980, filed on Oct. 30, 2015, provisional application No. 62/248,989, filed on Oct. 30, 2015, provisional application No. 62/248,780, filed on Oct. 30, 2015, provisional application No. 62/248,787, filed on Oct. 30, 2015, provisional application No. 62/248,795, filed on Oct. 30, 2015, provisional application No. 62/248,821, filed on Oct. 30, 2015, provisional application No. 62/248,829, filed on Oct. 30, 2015, provisional application No. 62/248,833, filed on Oct. 30, 2015, provisional application No. 62/248,835, filed on Oct. 30, 2015, provisional application No. 62/248,839, filed on Oct. 30, 2015, provisional application No. 62/248,841, filed on Oct. 30, 2015, provisional application No. 62/248,847, filed on Oct. 30, 2015, provisional application No. 62/248,848, filed on Oct. 30, 2015.

(51) Int. Cl.

*B29C 64/386* (2017.01)
*B29C 64/264* (2017.01)
*B29C 64/268* (2017.01)
*B23K 15/00* (2006.01)
*B23K 37/04* (2006.01)
*B23K 26/00* (2014.01)
*B23K 26/70* (2014.01)
*B23K 26/082* (2014.01)
*B23K 26/12* (2014.01)
*B23K 15/06* (2006.01)
*B23K 26/03* (2006.01)
*B33Y 10/00* (2015.01)
*B33Y 30/00* (2015.01)
*B33Y 40/00* (2020.01)
*B33Y 50/02* (2015.01)
*B23K 26/144* (2014.01)
*B23K 26/342* (2014.01)
*B23K 26/16* (2006.01)
*B28B 1/00* (2006.01)
*B23K 26/142* (2014.01)
*B33Y 70/00* (2020.01)
*B33Y 99/00* (2015.01)
*G05B 17/02* (2006.01)
*G02B 7/14* (2021.01)
*G02B 15/04* (2006.01)
*G02B 26/08* (2006.01)
*G02B 27/14* (2006.01)
*G02F 1/1333* (2006.01)
*G02F 1/135* (2006.01)
*H01S 5/00* (2006.01)
*H01S 5/40* (2006.01)
*B33Y 80/00* (2015.01)
*B23K 26/36* (2014.01)
*B25J 11/00* (2006.01)
*B23K 26/08* (2014.01)
*B22F 3/24* (2006.01)
*G02B 7/16* (2021.01)
*G02B 7/182* (2021.01)
*G02B 15/10* (2006.01)
*G02B 19/00* (2006.01)
*G02B 27/00* (2006.01)
*B23K 101/00* (2006.01)
*B23K 101/02* (2006.01)
*B23K 101/24* (2006.01)
*B23K 103/00* (2006.01)
*G07C 3/14* (2006.01)
*B29K 105/00* (2006.01)
*G02B 27/09* (2006.01)
*G02B 27/28* (2006.01)

(52) U.S. Cl.

CPC ...... *B23K 15/0006* (2013.01); *B23K 15/0013* (2013.01); *B23K 15/0026* (2013.01); *B23K 15/0086* (2013.01); *B23K 15/0093* (2013.01); *B23K 15/06* (2013.01); *B23K 26/0006* (2013.01); *B23K 26/03* (2013.01); *B23K 26/032* (2013.01); *B23K 26/082* (2015.10); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/342* (2015.10); *B23K 26/36* (2013.01); *B23K 26/702* (2015.10); *B23K 26/703* (2015.10); *B23K 26/704* (2015.10); *B23K 37/0408* (2013.01); *B23K 37/0426* (2013.01); *B25J 11/00* (2013.01); *B28B 1/001* (2013.01); *B29C 64/264* (2017.08); *B29C 64/268* (2017.08); *B29C 64/386* (2017.08); *B33Y 10/00* (2014.12); *B33Y 30/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02B 26/0816* (2013.01); *G02B 27/0068* (2013.01); *G02B 27/141* (2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 2003/1056* (2013.01); *B22F 2003/1057* (2013.01); *B22F 2003/1058* (2013.01); *B22F 2003/1059* (2013.01); *B22F 2003/247* (2013.01); *B22F 2003/248* (2013.01); *B22F 2998/10* (2013.01); *B22F 2999/00* (2013.01); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B29K 2105/251* (2013.01); *G02B 27/0905* (2013.01); *G02B 27/283* (2013.01); *G02B 27/286* (2013.01); *G05B 2219/49023* (2013.01); *G07C 3/146* (2013.01); *Y02P 10/295* (2015.11); *Y02P 80/40* (2015.11)

(58) Field of Classification Search

CPC .... H01S 5/0071; H01S 5/0085; H01S 5/4012; H01S 5/4025; H01S 5/4075; G02B 27/10; G02B 27/28; G02B 27/106; G02B 27/283; G02B 27/286

USPC .......................................................... 359/240
See application file for complete search history.

(56) References Cited

U.S. PATENT DOCUMENTS 5,155,324 A 10/1992 Deckard
5,236,637 A 8/1993 Hull
5,258,989 A 11/1993 Raven
5,314,003 A 5/1994 Mackay
5,382,308 A 1/1995 Bourell
5,508,489 A 4/1996 Benda
5,640,667 A 6/1997 Freitag
5,674,414 A 10/1997 Schweizer
5,837,960 A 11/1998 Lewis
6,005,717 A 12/1999 Neuberger
6,053,615 A 4/2000 Peterson
6,064,528 A 5/2000 Simpson, Jr.
6,183,092 B1 2/2001 Troyer
6,405,095 B1 6/2002 Jang
6,462,306 B1 10/2002 Kitai
6,560,001 B1 5/2003 Igasaki
6,666,556 B2 12/2003 Hansen
6,676,892 B2 1/2004 Das
6,717,106 B2 4/2004 Nagano
6,721,096 B2 4/2004 Bruzzone
6,781,763 B1 8/2004 Tamburino
7,088,432 B2 8/2006 Zhang
7,113,324 B2 9/2006 Lee
7,234,820 B2 6/2007 Harbers
7,444,046 B2 10/2008 Karlsen
7,509,738 B2 3/2009 Adams
7,569,174 B2 8/2009 Ruatta
7,713,048 B2 5/2010 Perret
7,820,241 B2 10/2010 Perret
8,199,787 B2 6/2012 Deri
8,425,043 B2 * 4/2013 Miyazawa ............. G03B 33/12
348/58
8,462,828 B1 6/2013 Estes
8,514,475 B2 8/2013 Deri
8,525,943 B2 9/2013 Burgess
8,553,311 B2 10/2013 Kleinert
8,568,646 B2 10/2013 Wang
8,575,528 B1 11/2013 Barchers
8,666,142 B2 3/2014 Shkolnik
8,784,720 B2 7/2014 Oberhofer
8,801,418 B2 8/2014 El-Siblani
8,815,143 B2 8/2014 John
8,902,497 B2 12/2014 Erlandson
8,982,313 B2 3/2015 Escuti
9,114,478 B2 8/2015 Scott
9,130,349 B2 9/2015 Volodin
9,136,668 B2 9/2015 Bayramian
9,172,208 B1 10/2015 Dawson
9,186,847 B2 11/2015 Fruth
9,192,056 B2 11/2015 Rubenchik
9,283,593 B2 3/2016 Bruck
9,308,583 B2 4/2016 El-Dasher
9,331,452 B2 5/2016 Bayramian
9,348,208 B2 5/2016 Suga
9,409,255 B1 8/2016 Martinsen
9,522,426 B2 12/2016 Das
9,573,193 B2 2/2017 Buller
9,815,139 B2 11/2017 Bruck
9,855,625 B2 1/2018 El-Dasher
9,910,346 B2 3/2018 Huang
9,962,767 B2 5/2018 Buller
10,166,751 B2 1/2019 Kramer
10,195,692 B2 2/2019 Rockstroh
10,195,693 B2 2/2019 Buller
10,279,598 B2 5/2019 Deppe
10,328,685 B2 6/2019 Jones
10,335,901 B2 7/2019 Ferrar
2002/0015654 A1 2/2002 Das
2002/0090313 A1 7/2002 Wang
2002/0149137 A1 10/2002 Jang
2002/0191235 A1 * 12/2002 O'Connor ............ G02B 27/283
359/9
2003/0052105 A1 3/2003 Nagano
2004/0240059 A1 12/2004 Li
2005/0083498 A1 4/2005 Jeng
2006/0034557 A1 2/2006 Li
2006/0091120 A1 5/2006 Markle
2006/0209409 A1 9/2006 Li
2006/0232750 A1 10/2006 Yokote
2007/0024825 A1 2/2007 Stephanes
2007/0053074 A1 3/2007 Krijn
2007/0122560 A1 5/2007 Adams
2007/0273797 A1 11/2007 Silverstein
2008/0231953 A1 9/2008 Young
2008/0246705 A1 10/2008 Russell
2008/0262659 A1 10/2008 Huskamp
2009/0020901 A1 1/2009 Schillen
2009/0206065 A1 8/2009 Kruth
2009/0221422 A1 9/2009 Miller
2010/0089881 A1 4/2010 Bruland
2010/0176539 A1 7/2010 Higashi
2011/0019705 A1 1/2011 Adams
2011/0033887 A1 2/2011 Fang
2011/0051092 A1 3/2011 Mashitani
2011/0278269 A1 11/2011 Gold
2012/0039565 A1 2/2012 Klein
2012/0188515 A1 7/2012 Huang
2013/0102447 A1 4/2013 Strong
2013/0112672 A1 5/2013 Keremes
2013/0136868 A1 5/2013 Bruck
2013/0270750 A1 10/2013 Green
2013/0271800 A1 10/2013 Kanugo
2013/0300286 A1 11/2013 Ljungblad
2013/0302533 A1 11/2013 Bruck
2014/0085631 A1 3/2014 Lacour
2014/0154088 A1 6/2014 Etter
2014/0252687 A1 9/2014 El-Dasher
2014/0263209 A1 9/2014 Burris
2014/0271965 A1 9/2014 Ferrar
2014/0367894 A1 12/2014 Kramer
2015/0061170 A1 3/2015 Engel et al.
2015/0132173 A1 5/2015 Bruck
2015/0165556 A1 6/2015 Jones
2015/0211083 A1 7/2015 Gabilondo
2015/0273632 A1 10/2015 Chen
2015/0283612 A1 10/2015 Maeda
2015/0283614 A1 10/2015 Wu
2015/0311064 A1 10/2015 Stuart
2015/0343664 A1 12/2015 Liu
2015/0360418 A1 12/2015 Shah
2015/0375456 A1 12/2015 Cheverton
2016/0067923 A1 3/2016 James
2016/0082662 A1 3/2016 Majer
2016/0114432 A1 4/2016 Ferrar
2016/0175935 A1 6/2016 Ladewig
2016/0236279 A1 8/2016 Ashton
2016/0243652 A1 8/2016 El-Dasher
2016/0279707 A1 9/2016 Mattes
2016/0322777 A1 11/2016 Zediker

FOREIGN PATENT DOCUMENTS

DE 102013205029 A1 9/2014
EP 0402944 A2 12/1990
EP 1115255 A1 7/2001
EP 2875897 A1 5/2015
EP 2926979 A1 10/2015
EP 2964418 B1 5/2019
GB 2453945 A 4/2009
JP 5933512 B2 6/2016
WO WO/2012/151262 A2 11/2012
WO WO/2014/199134 A1 12/2014
WO WO/2014/199149 A1 12/2014
WO WO/2014/074954 A3 1/2015
WO WO/2015/003804 A1 1/2015
WO 2015/025171 A2 2/2015
WO WO/2015/017077 A1 2/2015
WO WO/2015/108991 A2 7/2015
WO WO/2015/114032 A1 8/2015
WO WO/2015/120168 A1 8/2015
WO WO/2015/191257 A1 12/2015

(56) References Cited

FOREIGN PATENT DOCUMENTS

| | | | |
|---|---|---|---|
| WO | WO/2015/200138 | A1 | 12/2015 |
| WO | WO/2015/134075 | A3 | 1/2016 |
| WO | WO/2016/071265 | A1 | 5/2016 |
| WO | WO/2016/079496 | A3 | 6/2016 |
| WO | WO/2016/110440 | A1 | 7/2016 |
| WO | WO/2016/201309 | A1 | 12/2016 |
| WO | 2017/075231 | A2 | 5/2017 |
| WO | WO/2018/087218 | A1 | 5/2018 |

* cited by examiner

POLARIZATION COMBINING SYSTEM IN ADDITIVE MANUFACTURING

CROSS REFERENCE TO RELATED PATENT APPLICATION

The present disclosure is part of a non-provisional patent application claiming the priority benefit of U.S. Patent Application No. 62/248,758, filed on Oct. 30, 2015, U.S. Patent Application No. 62/248,765, filed on Oct. 30, 2015, U.S. Patent Application No. 62/248,770, filed on Oct. 30, 2015, U.S. Patent Application No. 62/248,776, filed on Oct. 30, 2015, U.S. Patent Application No. 62/248,783, filed on Oct. 30, 2015, U.S. Patent Application No. 62/248,791, filed on Oct. 30, 2015, U.S. Patent Application No. 62/248,799, filed on Oct. 30, 2015, U.S. Patent Application No. 62/248,966, filed on Oct. 30, 2015, U.S. Patent Application No. 62/248,968, filed on Oct. 30, 2015, U.S. Patent Application No. 62/248,969, filed on Oct. 30, 2015, U.S. Patent Application No. 62/248,980, filed on Oct. 30, 2015, U.S. Patent Application No. 62/248,989, filed on Oct. 30, 2015, U.S. Patent Application No. 62/248,780, filed on Oct. 30, 2015, U.S. Patent Application No. 62/248,787, filed on Oct. 30, 2015, U.S. Patent Application No. 62/248,795, filed on Oct. 30, 2015, U.S. Patent Application No. 62/248,821, filed on Oct. 30, 2015, U.S. Patent Application No. 62/248,829, filed on Oct. 30, 2015, U.S. Patent Application No. 62/248,833, filed on Oct. 30, 2015, U.S. Patent Application No. 62/248,835, filed on Oct. 30, 2015, U.S. Patent Application No. 62/248,839, filed on Oct. 30, 2015, U.S. Patent Application No. 62/248,841, filed on Oct. 30, 2015, U.S. Patent Application No. 62/248,847, filed on Oct. 30, 2015, and U.S. Patent Application No. 62/248,848, filed on Oct. 30, 2015, which are incorporated by reference in its entirety.

TECHNICAL FIELD

The present disclosure generally relates to optics and, more specifically, to polarization combining in additive manufacturing systems.

BACKGROUND

The ability to deliver high intensity laser light to the build platform is a requirement for additively manufacturing objects using laser based techniques in the powder bed fusion method. The exact laser intensity (energy per unit area) is material dependent and is based on the thermal diffusivity of the substance (the ratio of thermal conductivity to volumetric specific heat) as well as the melt temperature of the material and heat of fusion. Higher thermal diffusivity and higher melt temperatures mean that the material to be melted requires higher laser intensity.

To date, optical systems for semiconductor (e.g. diode) laser-based additive manufacturing with the highest time averaged intensity semiconductor lasers commercially available having the potential to achieve intensities of 117 kW/cm^2 while meeting an optical resolution requirement of 7 um point imaging full width half maximum (FWHM). Commercial solid state (e.g. fiber) based laser systems are able to focus their beam to very high intensities with ease due to the high beam quality and coherence. Experiments have shown that intensities greater than 370 kW/cm^2 are sufficient to generate fully dense stainless steel parts using the laser powder bed fusion method. Intensities lower than this will potentially not bond the melted powder to the base before surface tension pulls it into a ball. It is thus a requirement to avoid this effect for additively manufacturing materials using the laser based powder bed fusion method.

Semiconductor lasers are typically cheaper than solid state laser systems commonly used in powder bed fusion additive manufacturing systems. While semiconductor lasers are cheaper, they suffer in brightness. Currently, solid state laser systems are capable of achieving feature sizes of ~100 um, while also maintaining a large distance greater than 250 mm between the final build platform and the powder distribution mechanism to allow new layers of powder to be deposited. To achieve the same resolution on the powder bed of suitable length with semiconductor lasers, high brightness is a requirement.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1A:
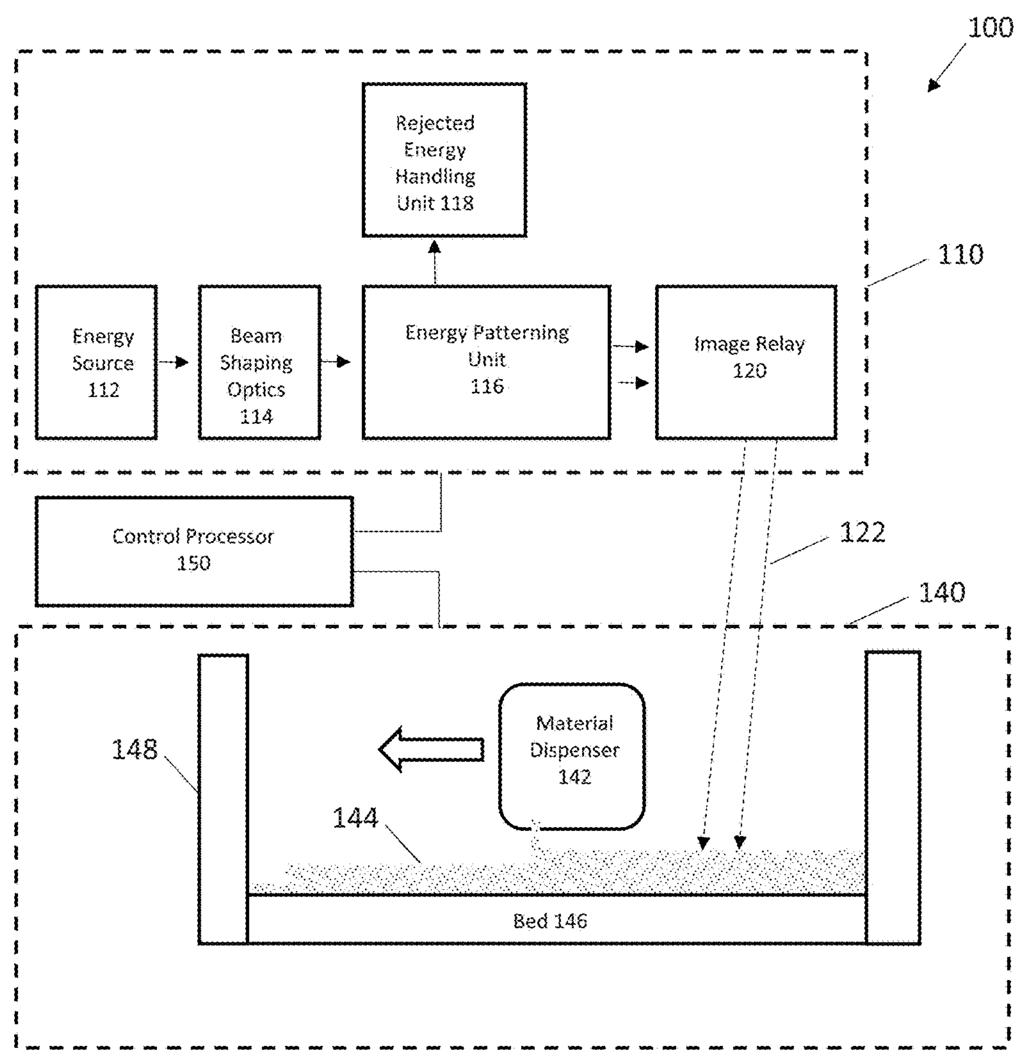
FIG. 1A illustrates an additive manufacturing system.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure proposes an optical system suitable for high-resolution imaging of high average power light sources independent of wavelength, thus allowing the combination of polarization states to increase laser intensity and/or reduce system power losses. Accordingly, the proposed optical system may be suitable for use in semiconductor laser-based additive manufacturing. Using polarization combining optical geometries enables up to 2× increase in output intensity, near 100% transmission efficiency, or both. Increases in semiconductor laser intensity allow for the processing of wider ranges of.

The disclosed optical system is capable of increasing the intensity and/or efficiency of semiconductor laser light through polarization combination. Semiconductor lasers are typically polarized to about 70-90% in one polarization state. When using a polarization rotating method to pattern the light, the 10-20% of the light in the undesired polarization state could potentially go unused (rejected). To avoid this loss, polarization combining and patterning can be used to either boost transmission efficiency or increase resultant intensity by a factor of 2, or both.

One example of semiconductor lasers and polarization states is to use highly polarized semiconductor lasers, with half of the lasers oriented in one polarization state, and half in the other. The minority polarization state of the two polarization states in each half of the semiconductor lasers is rejected, with the majority polarization state passed through a spatial light modulator (such as an optically addressed light valve) corresponding to the respective polarization state of the light. Each light valve applies a polarization pattern to the laser light, and each of the two light valves may have different or the same applied pattern. The two different polarization states are then combined to achieve two times (2×) the initial intensity while maintaining the desired polarization state pattern. In some embodiments, the two polarization states may be patterned by any mask or other light blocking mechanism and then re-combined because of their different polarization states. In some embodiments, the two polarization states may be first combined because of their different polarization states and then patterned by any mask or other light blocking mechanism.

A second example of lasers and polarization states is to use more than one laser of an arbitrary polarization state. A polarizer is used to split the beam(s) into its (their) respective polarization state(s), and spatially stack the beam(s) of corresponding polarization state(s) close together by spatial positioning creating two effective beams, with one of each polarization state. These two beams, of different polarization state, are then passed through a light modulator relating to their perspective polarization state, then with a polarization state pattern applied in the beam, and subsequently beam combined by polarization combining. This method uses all light in the process, which allows for higher usage of the laser light, thereby achieving minimal to no losses, due to variance in polarization state, as well as better system efficiency.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/MnCl2) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate (Nd:YVO4) laser, Neodymium doped yttrium calcium oxoborateNd:YCa4O(BO3)3 or simply Nd:YCOB, Neodymium glass (Nd:Glass) laser, Titanium sapphire (Ti:sapphire) laser, Thulium YAG (Tm:YAG) laser, Ytterbium YAG (Yb:YAG) laser, Ytterbium:2O3 (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride (Ce:LiSAF, Ce:LiCAF), Promethium 147 doped phosphate glass (147Pm+3:Glass) solid-state laser, Chromium doped chrysoberyl (alexandrite) laser, Erbium doped anderbium-ytterbium co-doped glass lasers, Trivalent uranium doped calcium fluoride (U:CaF2) solid-state laser, Divalent samarium doped calcium fluoride (Sm:CaF2) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a “beam dump” to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
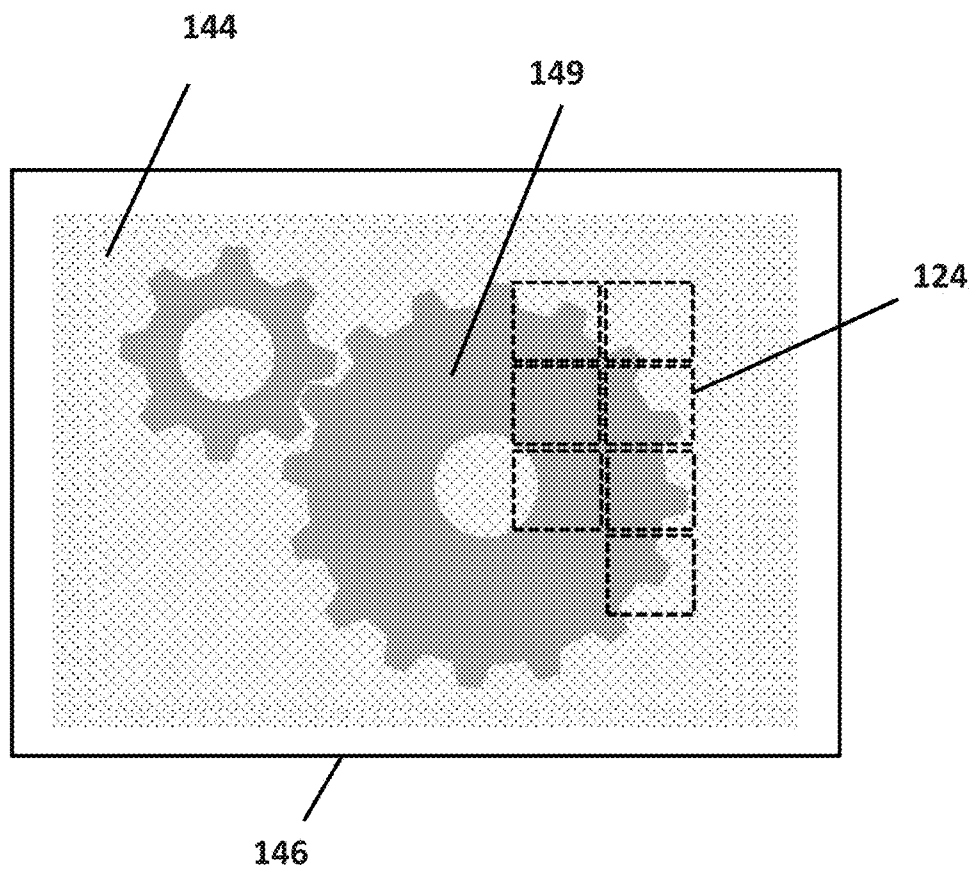
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
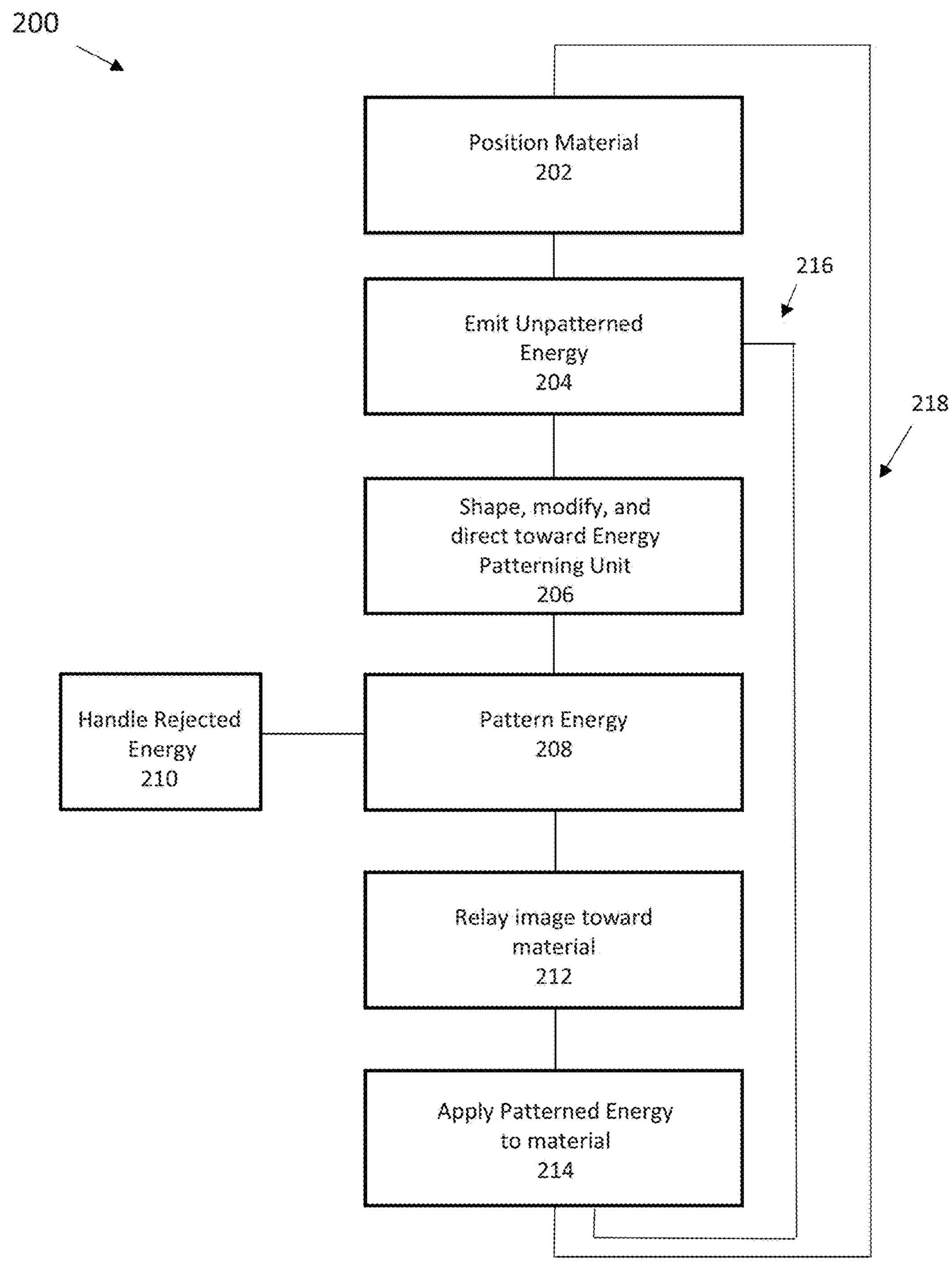
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
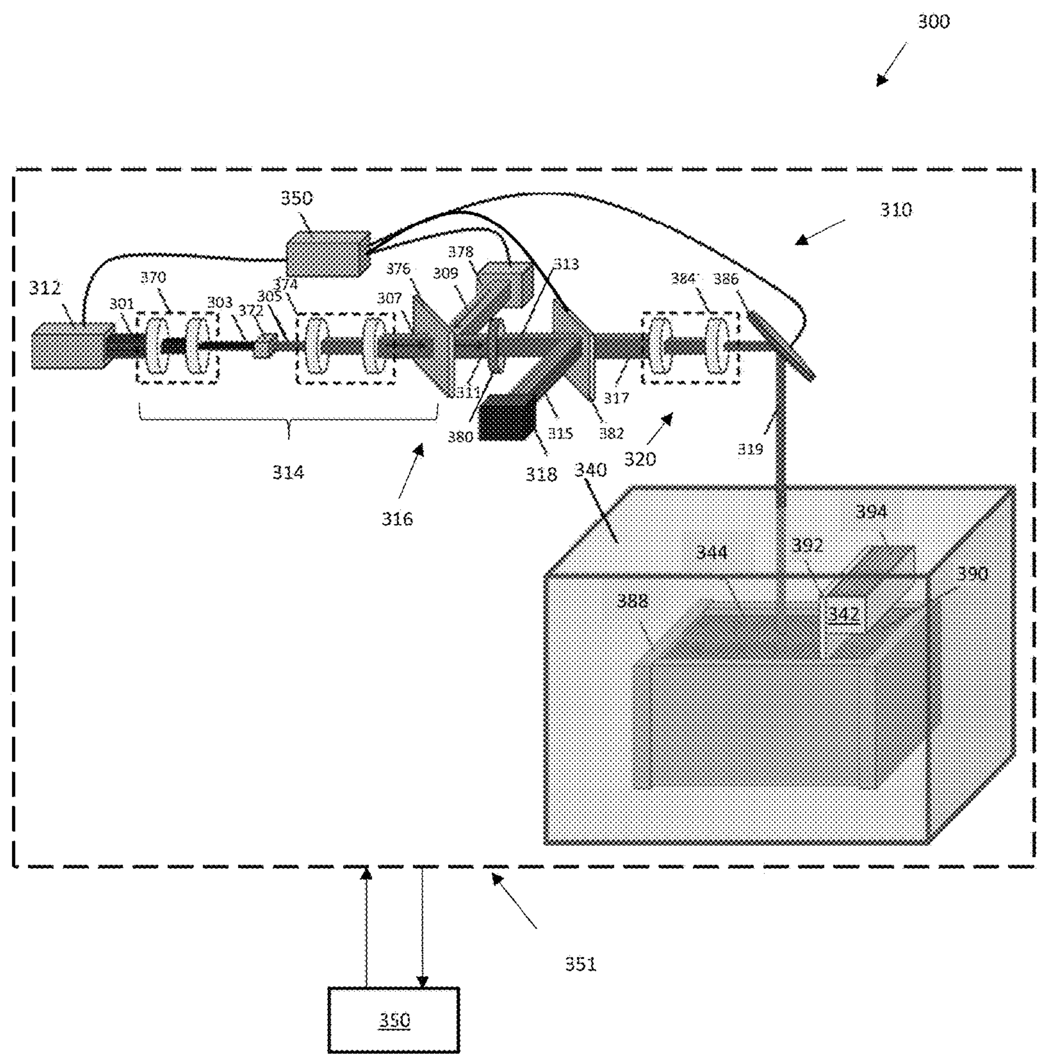
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
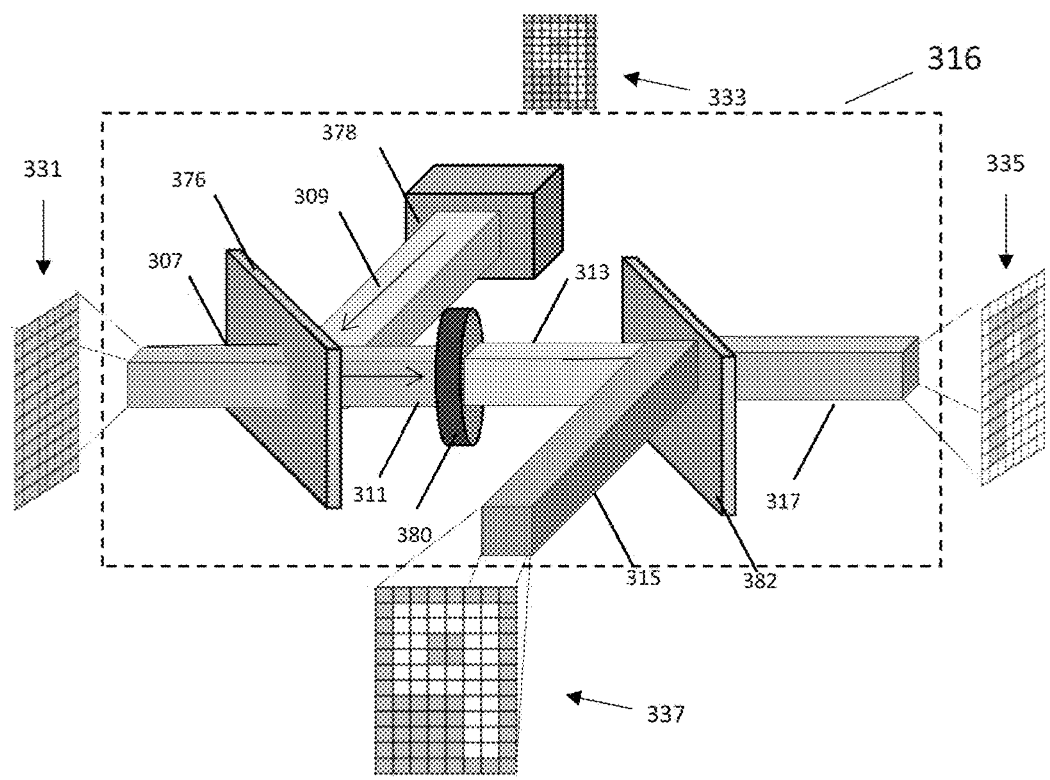
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
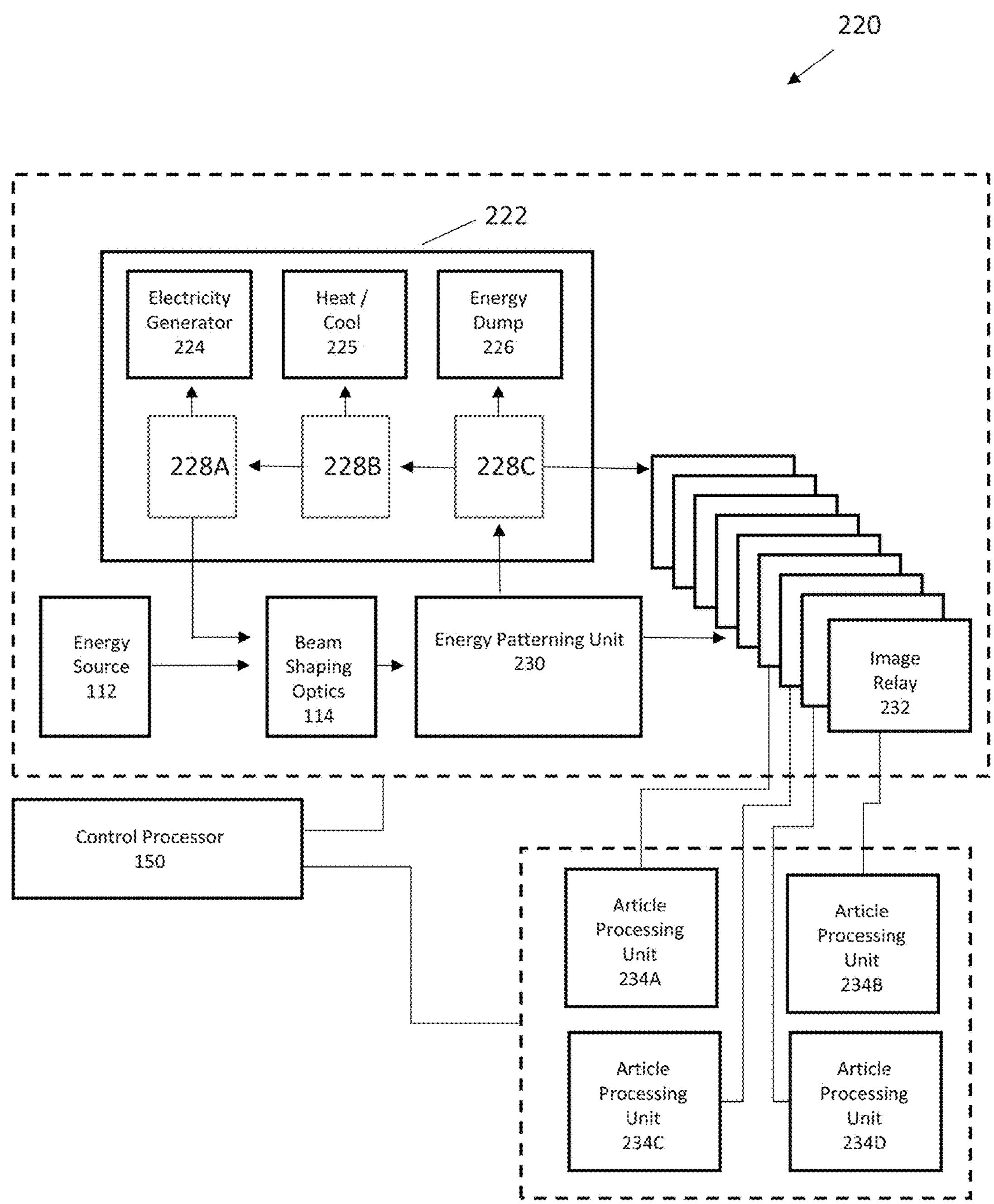
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
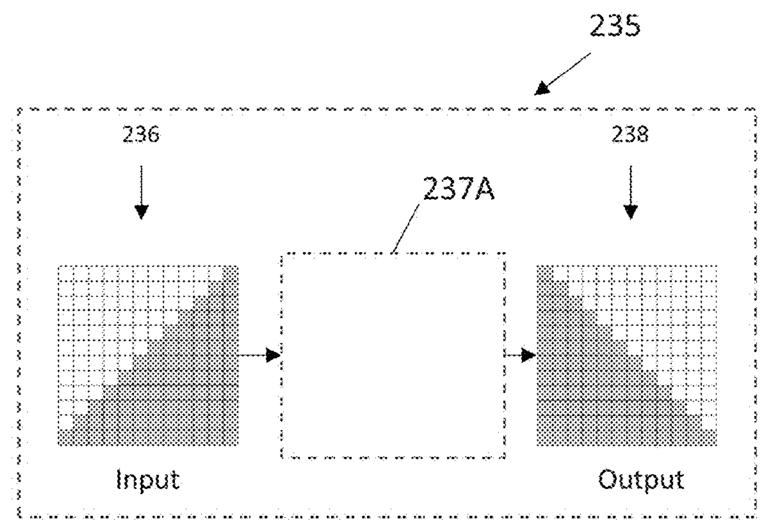
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
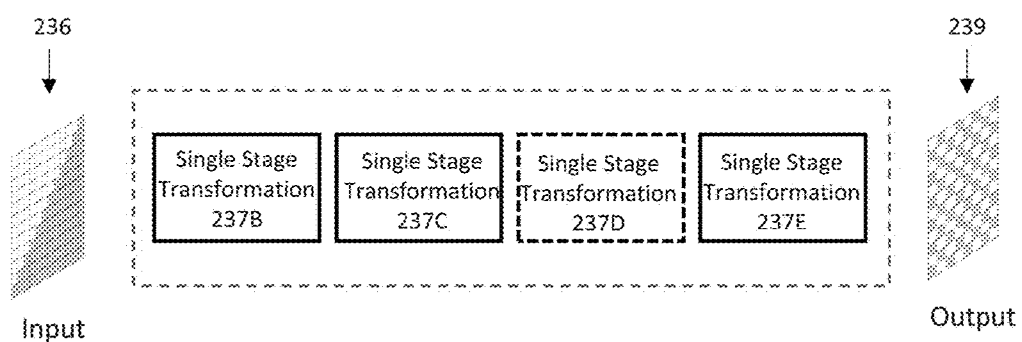
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
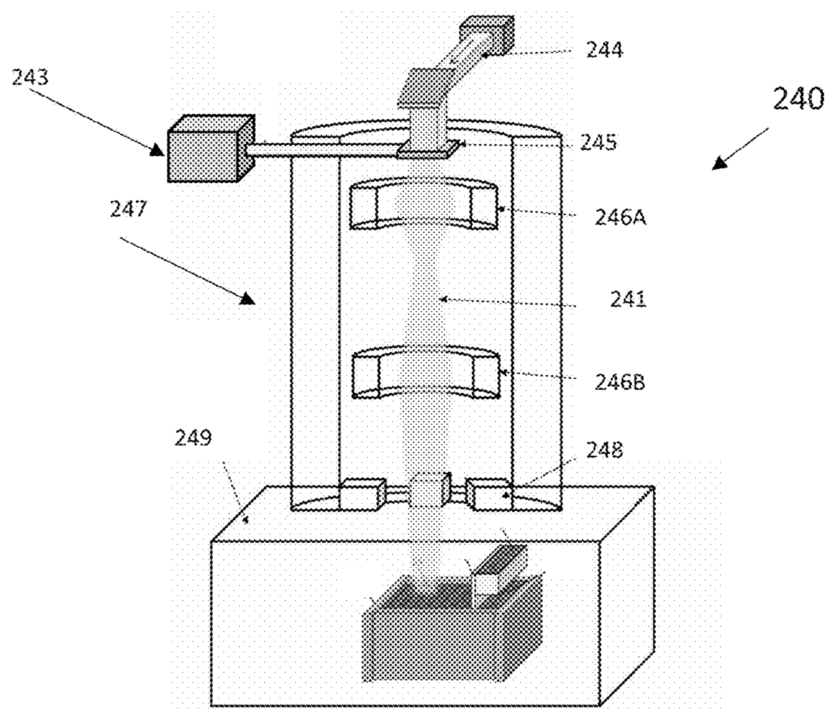
FIG. 3F illustrates an patternable electron energy beam additive manufacturing system.
Figure 3G:
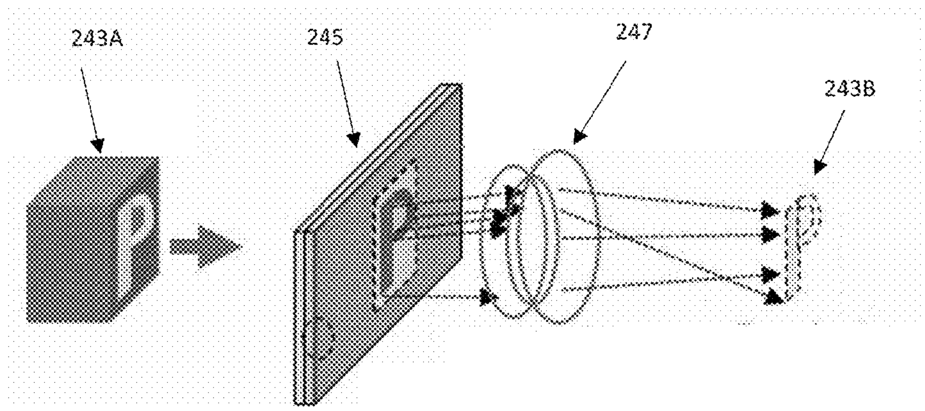
FIG. 3G illustrates a detailed description of the electron beam patterning unit shown in FIG. 3.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4:
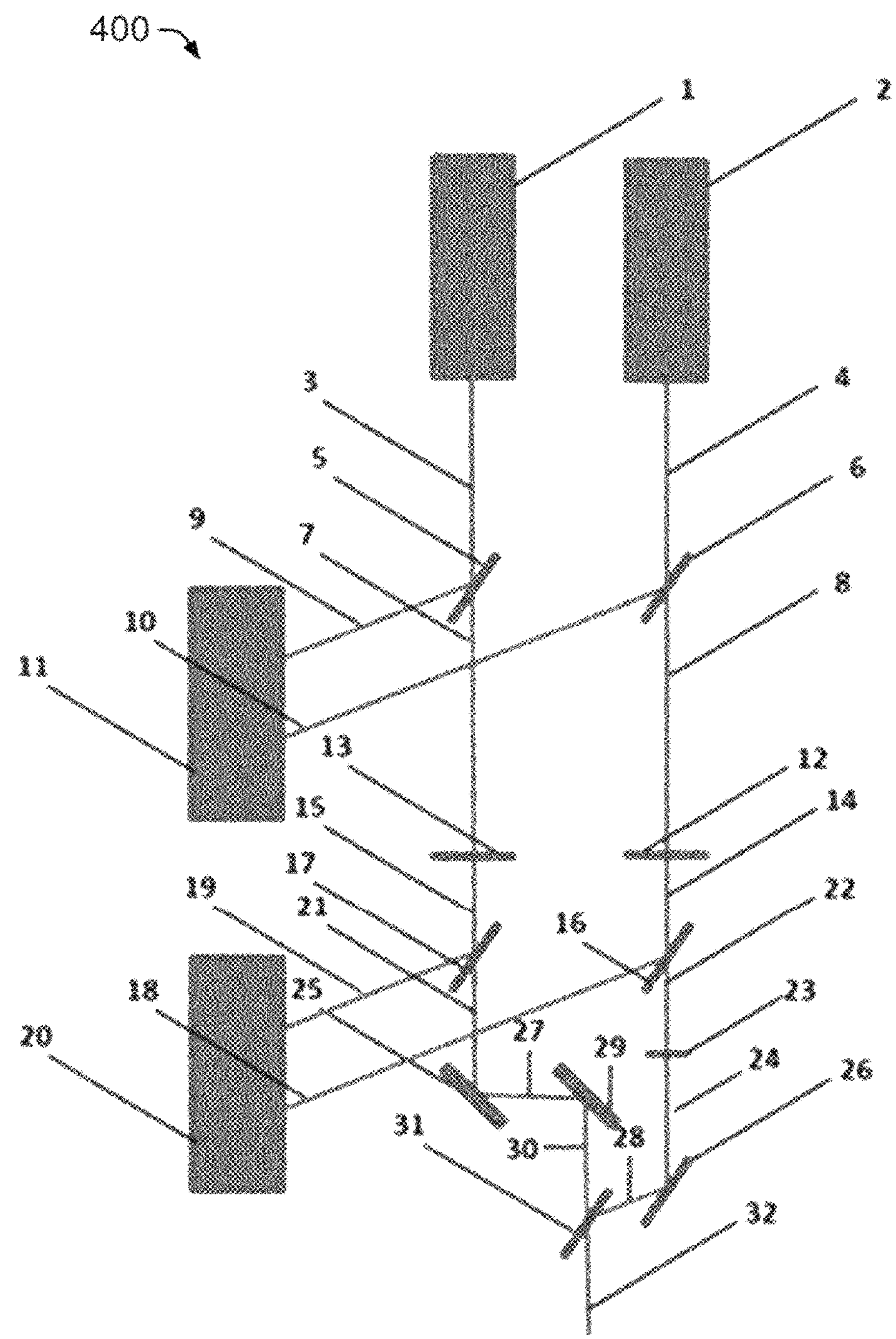
FIG. 4 is a diagram illustrating an example optical assembly of polarization combining to achieve up to two times the original semiconductor laser intensity in accordance with an embodiment of the present disclosure.

FIG. 4 illustrates an example optical assembly 400 of polarization combining to achieve up to 2× of the original semiconductor laser intensity (in the limit) in accordance with the present disclosure. Optical assembly 400 may include some or all of those components shown in FIG. 4, to be described below.

Light sources 1 and 2 are each used as a high power photon source. In some embodiments, light sources 1 and 2 may be semiconductor laser arrays with 33.3 kW of power each, emitting photons at 1000 nm that are shaped and blended into a square beam 20 mm wide×20 mm. Emitted light may be 90% polarized in state p resulting in light beams 3 and 4. The emitted light beams 3 and 4 may be incident on polarizers 5 and 6, respectively. Polarizers 5 and 6 may reflect s-polarization to result in light beams 9 and 10, which may be incident on a beam dump 11. Polarizers 5 and 6 may transmit p-polarization to result in light beams 8 and 7, which may be incident on polarization rotating optically addressed light valves 12 and 13, respectively. Each of light valves 12 and 13 may have the same image applied to light beams 8 and 7 to create polarization patterns, and may spatially flip 20% of the "pixels" from p-polarization to s-polarization in the desired patterns resulting in light beams 14 and 15. Beams 14 and 15 may be incident on polarizers 16 and 17, respectively. Polarizers 16 and 17 may reflect s-polarization to result in light beams 18 and 19, respectively, which may contain 20% of the energy and may be dumped to a beam dump 20. Polarizers 16 and 17 may transmit p-polarization to result in light beams 21 and 22. Beam 22 may be incident on a half wave plate 23 which rotates the polarization of every photon by a half wave, thereby turning p-polarization to s-polarization to result in light beam 24. Beams 21 and 24 may be incident on mirrors 25 and 26, respectively, to result in light beams 27 and 28. Beam 27 may be incident on mirror 29 to result in beam 30, which may be incident on polarizer 31 in p-polarization. Beam 28 in s-polarization may be incident on polarizer 31 which may reflect s-polarization of beam 28 and transmit p-polarization of beam 30 to result in light beam 32. Beam 32 may be a beam of twice the intensity of a single polarization state from light source 1 or 2, for a total initial intensity of 1.8× the original due to the 90% initial polarization, and proportionally less that for the 20% of the polarization map image applied at light valves 12 and 13. Total propagated intensity at beam 32 may be 1.44× the initial intensity for a total transmitted power of 47.52 kW emitted. Imaged to the original 20×20 mm square, the final intensity may be 11.88 $kW/cm^2$ if divergence angle is maintained.

Figure 5:
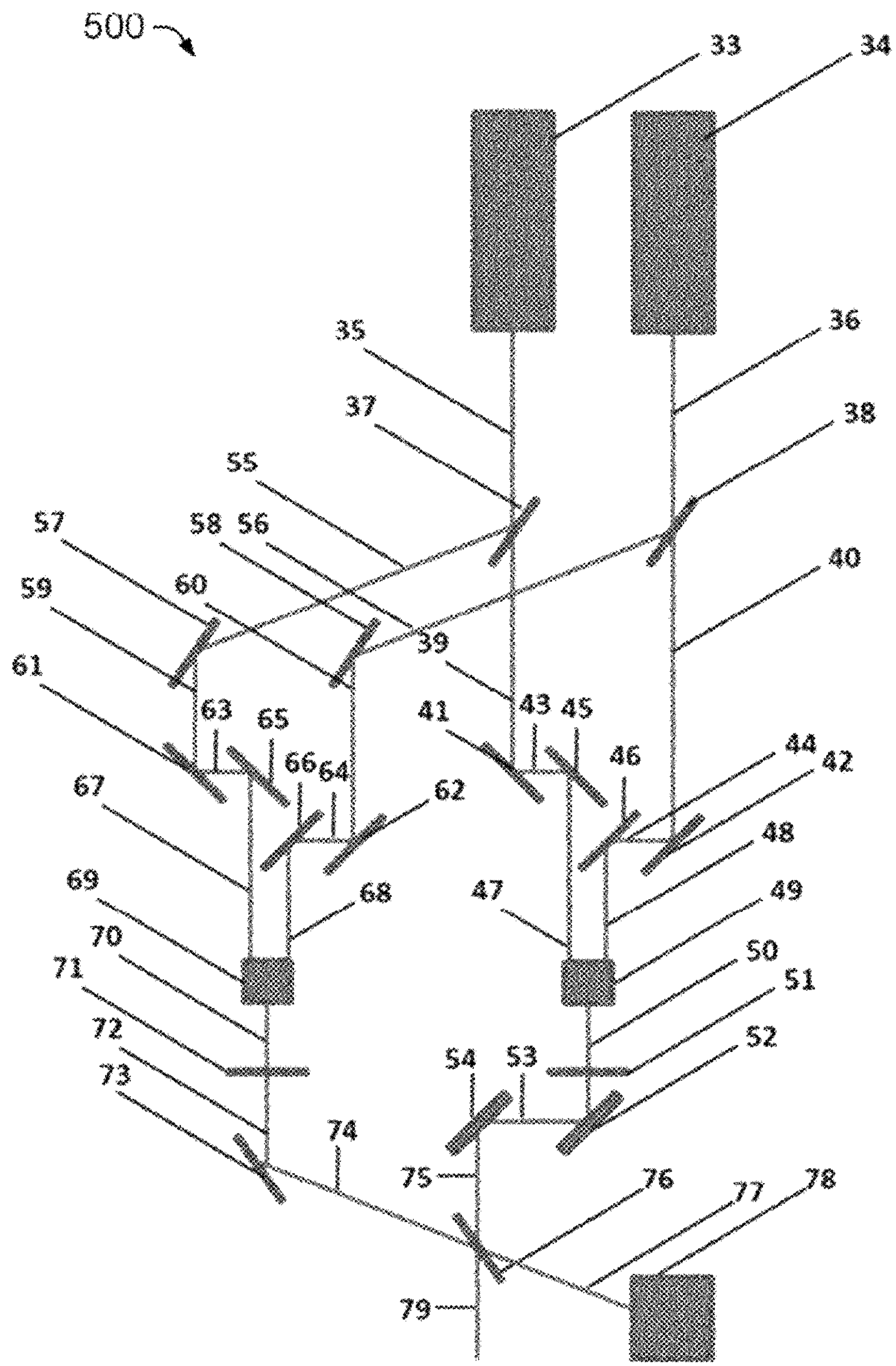
FIG. 5 is a diagram illustrating an example optical assembly of polarization combining to achieve up to 100% system transmission of the original semiconductor laser intensity in accordance with an embodiment of the present disclosure.

FIG. 5 illustrates an example optical assembly 500 of polarization combining to achieve up to 100% system transmission of the original semiconductor laser intensity in accordance with the present disclosure. Optical assembly 500 may include some or all of those components shown in FIG. 5, to be described below.

Light sources 33 and 34 are each used as a high power photon source. In some embodiments, light sources 33 and 34 may be semiconductor lasers with 33.3 kW of power each, emitting photons at 1000 nm that are shaped and blended into a square beam 20 mm wide×20 mm or not shaped or blended. Emitted light may be 90% polarized in p-polarization state, resulting in light beams 35 and 36. Beams 35 and 36 may be incident on polarizers 37 and 38, respectively. Polarizers 37 and 38 may transmit p-polarization to result in light beams 39 and 40, which may be incident on mirrors 41 and 42, respectively, to result in light beams 43 and 44. Beams 43 and 44 may be incident on mirrors 45 and 46 to result in light beams 47 and 48, which may be as close together as spatially allowed without overlap. Beams 47 and 48 may be blended together in a homogenizer 49 to result in light beam 50, which may be incident on a polarization altering light valve 51. Light valve 51 may rotate 20% (which may be a variable based upon the desired image to be applied to light valves 51 and 61) of the p-polarization state to s-polarization. The light leaving 51 may be incident on mirror 52 to result in light beam 53, which may be incident on mirror 54 to result in light beam 65. Polarizers 37 and 38 may reflect s-polarization to result in light beams 55 and 56, which may be incident on mirrors 57 and 58, respectively, to result in light beams 59 and 60. Beams 59 and 60 may be incident on mirrors 61 and 62 to result in light beams 63 and 64, respectively, which may in turn be incident on mirrors 65 and 66, respectively, to result in light beams 67 and 68. Beams 67 and 68 may be as close together as spatially allowed without overlap. Beams 67 and 68 may be blended together in a homogenizer 69 to result in light beam 60, which may be incident on a polarization altering light valve 61. Light valve 61 may rotate 20% (which may be a variable based upon the desired image to be applied to light valves 51 and 61) of the s-polarization state to p-polarization. The light leaving light valve 61 may result in light beam 62, which may be incident on mirror 63 and reflected into light beam 64. Beams 64 and 65 may be incident on polarizer 66, which may reflect s-polarization and transmits p-polarization. The negative and un-desired image may result in light beam 67, which may be dumped to a beam-dump 68, while a resultant light beam 69 may be desired.

In optical assembly 500, the light that is dumped is the 20% rejected due to the patterning mechanism of light valves 51 and 61. Final laser power may be 70% of 2*33.33 kW for 53.28 kW. Unlike optical assembly 400, the comparable intensity would be over twice the area due to spatial combination of beams resulting in 6.66 kW/cm^2 if divergence angle is maintained.

In some embodiments, the two or more spatial light modulators may include at least a mask or a light blocking device. In such cases, the optical sub-assembly may be configured to combine the two or more beams of light because of the different polarization states.

In some embodiments, the optical sub-assembly may be configured to combine the majority polarization state and the minority polarization state of the two or more beams of light because of the different polarization states. In such cases, the two or more spatial light modulators may include at least a mask or a light blocking device configured to pattern each of the two or more beams of light after the combining.

In some embodiments, the two or more spatial light modulators may include two or more optically addressed light valves or two or more liquid crystal display devices configured to apply the respective polarization pattern on the majority polarization state of each of the two or more beams of light.

In some embodiments, the optical sub-assembly may be further configured to perform a number of operations. For instance, the optical sub-assembly may split each of the two or more beams of light into two split beams each corresponding to the majority polarization state or the minority polarization state, respectively. Moreover, the optical sub-assembly may spatially stack the split beam of each of the two or more beams of light corresponding to the majority polarization state to provide a first beam of light corresponding to the majority polarization state. Furthermore, the optical sub-assembly may spatially stack the split beam of each of the two or more beams of light corresponding to the minority polarization state to provide a second beam of light corresponding to the minority polarization state. Additionally, the optical sub-assembly may combine the patterned first and second beams of light to provide the single beam of light.

In some embodiments, the two or more spatial light modulators may include a first optically addressed light valve or a first liquid crystal display device configured to apply a majority polarization pattern on the first beam of light. Additionally, the two or more spatial light modulators may include a second optically addressed light valve or a second liquid crystal display device configured to apply a minority polarization pattern on the second beam of light.

In some embodiments, in spatially stacking the split beam of each of the two or more beams of light corresponding to the majority polarization state to provide the first beam of light corresponding to the majority polarization state, the optical sub-assembly may be configured to perform a number of operations. For instance, the optical sub-assembly may spatially stack, by a first set of mirrors of the optical sub-assembly, two or more split beams of the two or more beams of light corresponding to the majority polarization state. Moreover, the optical sub-assembly may homogenize, by a first homogenizer of the optical sub-assembly, the spatially stacked two or more split beams to provide the first beam of light. In some embodiments, in spatially stacking the split beam of each of the two or more beams of light corresponding to the minority polarization state to provide the second beam of light corresponding to the minority polarization state, the optical sub-assembly may be configured to perform a number of other operations. For instance, the optical sub-assembly may spatially stack, by a second set of mirrors of the optical sub-assembly, two or more split beams of the two or more beams of light corresponding to the minority polarization state. Furthermore, the optical sub-assembly may homogenize, by a second homogenizer of the optical sub-assembly, the spatially stacked two or more split beams to provide the second beam of light.

In some embodiments, in splitting each of the two or more beams of light into two split beams each corresponding to the majority polarization state or the minority polarization state, respectively, the optical sub-assembly may be configured to spatially stack, by a set of mirrors of the optical sub-assembly, the two or more beams of light prior to the splitting. Additionally, the optical sub-assembly may split, by a set of polarizers of the optical sub-assembly, each of the spatially combined two or more beams of light into the two split beams each corresponding to the majority polarization state or the minority polarization state, respectively.

Figure 6:
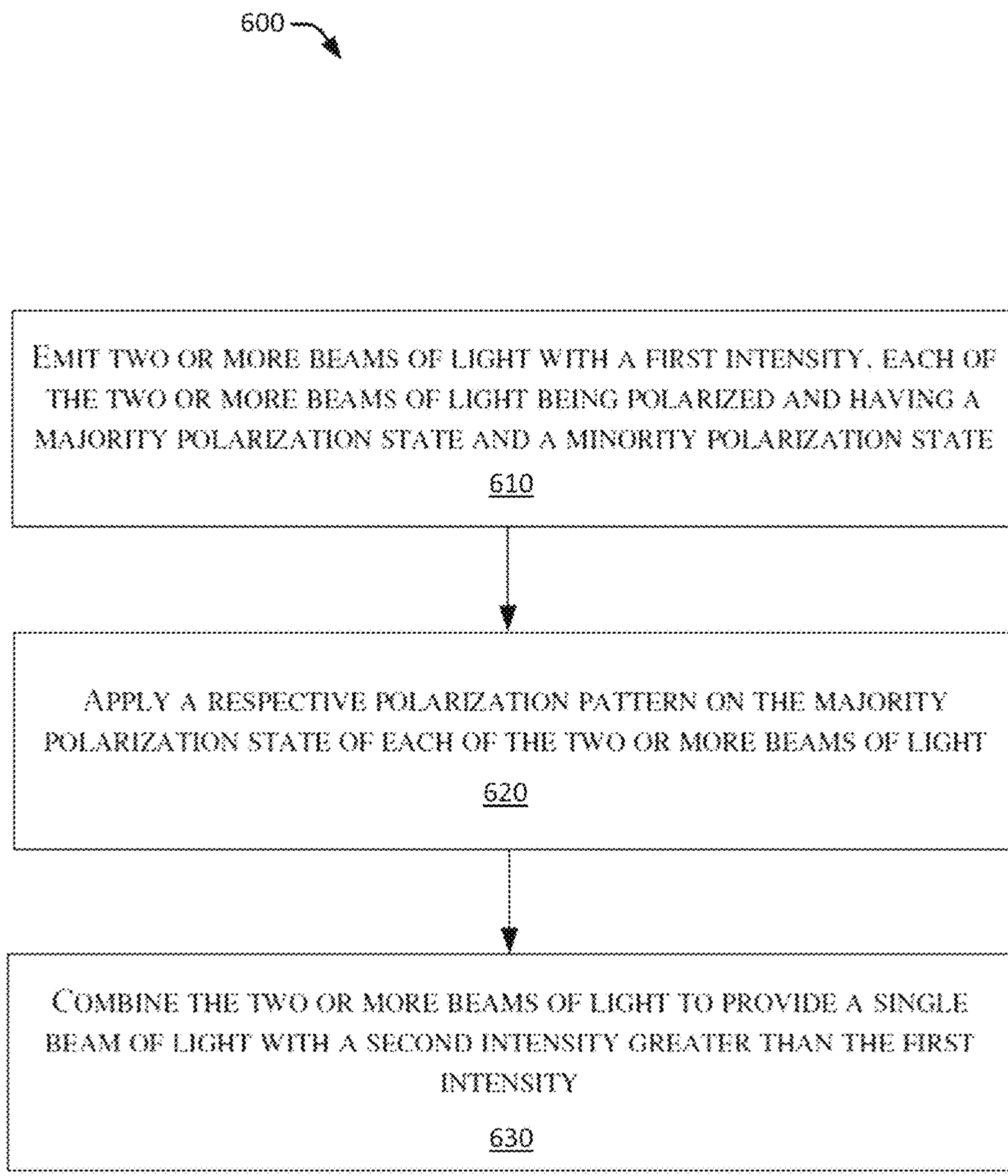
FIG. 6 is a flowchart of an example process in accordance with the present disclosure.

FIG. 6 illustrates an example process 600 in accordance with the present disclosure. Process 600 may be utilized to realize polarization combining for increased intensity and efficiency in additive manufacturing in accordance with the present disclosure. Process 600 may include one or more operations, actions, or functions shown as blocks such as 610, 620 and 630. Although illustrated as discrete blocks, various blocks of process 600 may be divided into additional blocks, combined into fewer blocks, or eliminated, depending on the desired implementation, and may be performed or otherwise carried out in an order different from that shown in FIG. 6. Process 600 may be implemented by optical assembly 400 and/or optical assembly 500, as well as powder bed fusion additive manufacturing system 600. Process 600 may begin with block 610.

At 610, process 600 may involve emitting two or more beams of light with a first intensity. Each of the two or more beams of light may be polarized and may have a majority polarization state and a minority polarization state. Process 600 may proceed from 610 to 620.

At 620, process 600 may involve rejecting or splitting off light not in the majority polarization state, and then applying a respective polarization pattern on the majority polarization state of each of the two or more beams of light. Process 600 may proceed from 620 to 630.

At 630, process 600 may involve combining the two or more beams of light to provide a single beam of light with a second intensity greater than the first intensity.

In some embodiments, the majority polarization state and the minority polarization state of the two or more beams of light may be respectively patterned by a mask or a light blocking device. Moreover, the two or more beams of light may be combined because of the different polarization states.

In some embodiments, the majority polarization state and the minority polarization state of the two or more beams of light may be combined because of the different polarization states. Moreover, each of the two or more beams of light may be respectively patterned by a mask or a light blocking device after the combining.

In some embodiments, in applying the respective polarization pattern on the majority polarization state of each of the two or more beams of light, process 600 may involve applying, by a respective one of two or more optically addressed light valves or two or more liquid crystal display devices, the respective polarization pattern on the majority polarization state of each of the two or more beams of light.

Figure 7:
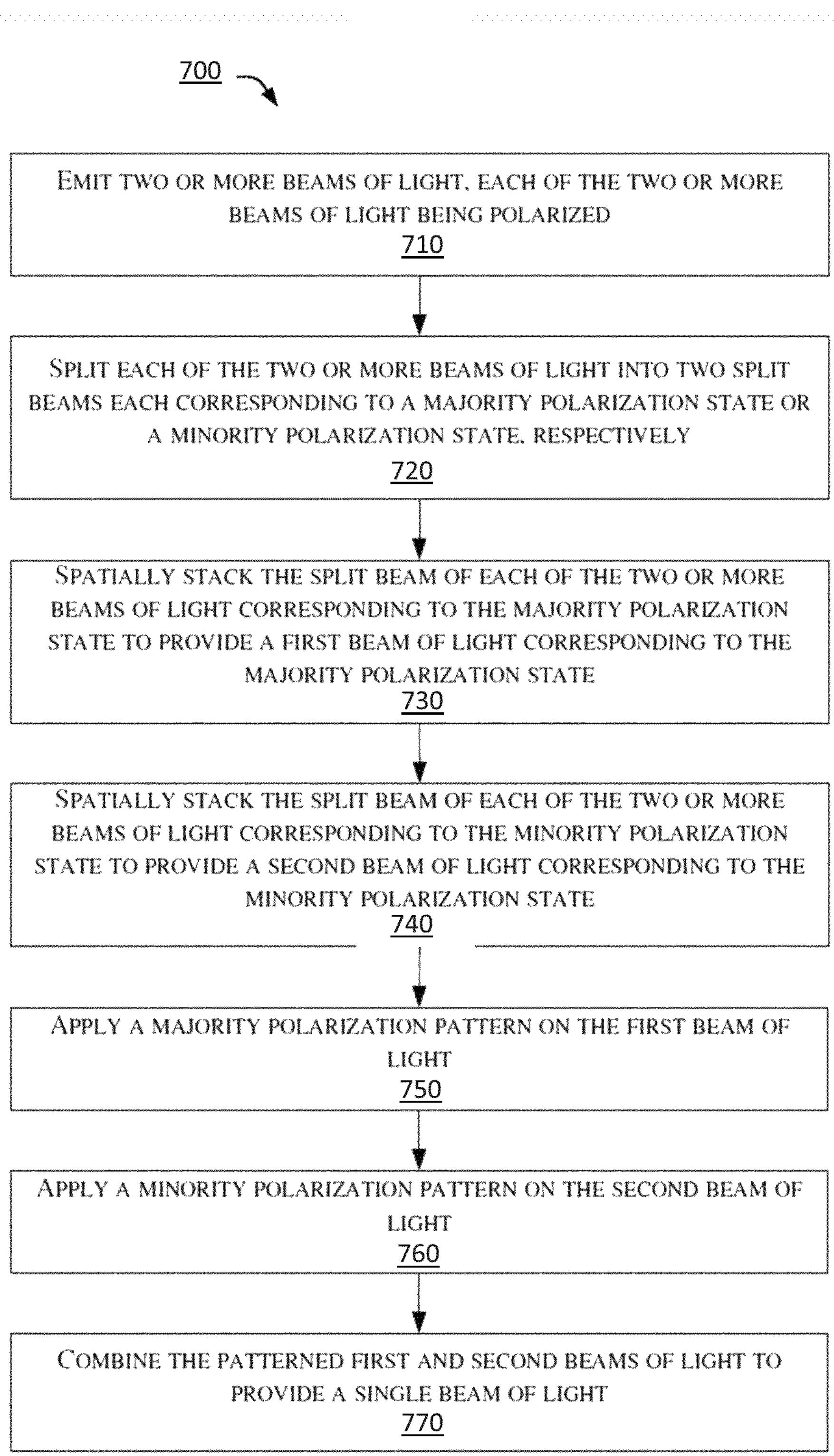
FIG. 7 is a flowchart of another example process in accordance with the present disclosure.

FIG. 7 illustrates an example process 700 in accordance with the present disclosure. Process 700 may be utilized to realize polarization combining for increased intensity and efficiency in additive manufacturing in accordance with the present disclosure. Process 700 may include one or more operations, actions, or functions shown as blocks such as 710, 720, 730, 740, 750, 760 and 770. Although illustrated as discrete blocks, various blocks of process 700 may be divided into additional blocks, combined into fewer blocks, or eliminated, depending on the desired implementation, and may be performed or otherwise carried out in an order different from that shown in FIG. 7. Process 700 may be implemented by optical assembly 400 and/or optical assembly 500, as well as powder bed fusion additive manufacturing system 600. Process 700 may begin with block 710.

At 710, process 700 may involve emitting two or more beams of light, each of the two or more beams of light being polarized. Process 700 may proceed from 710 to 720.

At 720, process 700 may involve splitting each of the two or more beams of light into two split beams each corresponding to a majority polarization state or a minority polarization state, respectively. Process 700 may proceed from 720 to 730.

At 730, process 700 may involve spatially stacking the split beam of each of the two or more beams of light corresponding to the majority polarization state to provide a first beam of light corresponding to the majority polarization state. Process 700 may proceed from 730 to 740.

At 740, process 700 may involve spatially stacking the split beam of each of the two or more beams of light corresponding to the minority polarization state to provide a second beam of light corresponding to the minority polarization state. Process 700 may proceed from 730 to 740.

At 750, process 700 may involve applying a majority polarization pattern on the first beam of light. Process 700 may proceed from 750 to 760.

At 760, process 700 may involve applying a minority polarization pattern on the second beam of light. Process 700 may proceed from 760 to 770.

At 770, process 700 may involve combining the patterned first and second beams of light to provide a single beam of light.

In some embodiments, the single beam of light may have an intensity greater than an intensity of the two or more beams of light.

In some embodiments, in applying the majority polarization pattern on the first beam of light, process 700 may involve applying the majority polarization pattern by an optically addressed light valve or a liquid crystal display device corresponding to the majority polarization state. Additionally, in applying the minority polarization pattern on the second beam of light, process 700 may involve applying the minority polarization pattern by an optically addressed light valve or a liquid crystal display device corresponding to the minority polarization state.

In some embodiments, in spatially stacking the split beam of each of the two or more beams of light corresponding to the majority polarization state to provide the first beam of light corresponding to the majority polarization state, process 700 may involve spatially stacking two or more split beams of the two or more beams of light corresponding to the majority polarization state. Moreover, process 700 may involve homogenizing the spatially stacked two or more split beams to provide the first beam of light.

In some embodiments, in spatially stacking the split beam of each of the two or more beams of light corresponding to the minority polarization state to provide the second beam of light corresponding to the minority polarization state, process 700 may involve spatially stacking two or more split beams of the two or more beams of light corresponding to the minority polarization state. Furthermore, process 700 may involve homogenizing the spatially stacked two or more split beams to provide the second beam of light.

In some embodiments, in splitting each of the two or more beams of light into two split beams each corresponding to the majority polarization state or the minority polarization state, respectively, process 700 may involve spatially stacking the two or more beams of light prior to the splitting. Additionally, process 700 may involve splitting each of the spatially combined two or more beams of light into the two split beams each corresponding to the majority polarization state or the minority polarization state, respectively.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A method, comprising:

emitting two or more beams of light with a first intensity, each of the two or more beams of light being polarized and having a majority polarization state and a minority polarization state;

applying a respective polarization pattern on the majority polarization state of each of the two or more beams of light without applying a polarization pattern on the minority polarization state of each of the two or more beams of light by directing the minority polarization of each of the two or more beams of light to a beam dump; and combining the two or more beams of light to provide a single beam of light with a second intensity greater than the first intensity.

2. The method of claim 1, wherein the majority polarization state and the minority polarization state of the two or more beams of light are respectively patterned by a mask or a light rejection device, and wherein the two or more beams of light are combined because of the different polarization states.

3. The method of claim 1, wherein light not in a majority polarization state is rejected before applying the respective majority polarization pattern.

4. The method of claim 1, wherein the applying of the respective polarization pattern on the majority polarization state of each of the two or more beams of light comprises applying, by a respective one of two or more optically addressed light valves or two or more liquid crystal display devices, the respective polarization pattern on the majority polarization state of each of the two or more beams of light.

5. A method, comprising:

emitting one or more beams of light, each of the one or more beams of light being polarized;

splitting each of the two or more beams of light into two split beams each corresponding to a majority polarization state or a minority polarization state, respectively;

spatially stacking the split beam of each of the two or more beams of light corresponding to the majority polarization state to provide a first beam of light corresponding to the majority polarization state;

spatially stacking the split beam of each of the two or more beams of light corresponding to the minority polarization state to provide a second beam of light corresponding to the minority polarization state;

applying a majority polarization pattern on the first beam of light;

applying a minority polarization pattern on the second beam of light; and combining the patterned first and second beams of light to provide a single beam of light, wherein the spatially stacking of the split beam of each of the two or more beams of light corresponding to the majority polarization state to provide the first beam of light corresponding to the majority polarization state comprises:

spatially stacking two or more split beams of the two or more beams of light corresponding to the majority polarization state; and homogenizing the spatially stacked two or more split beams to provide the first beam of light, and wherein the spatially stacking of the split beam of each of the two or more beams of light corresponding to the minority polarization state to provide the second beam of light corresponding to the minority polarization state comprises:

spatially stacking two or more split beams of the two or more beams of light corresponding to the minority polarization state; and homogenizing the spatially stacked two or more split beams to provide the second beam of light.

6. The method of claim 5, wherein light not in the majority polarization state is rejected before applying the respective majority polarization pattern.

7. The method of claim 5, wherein the applying of the majority polarization pattern on the first beam of light comprises applying the majority polarization pattern by an optically addressed light valve or a liquid crystal display device corresponding to the majority polarization state, and wherein the applying of the minority polarization pattern on the second beam of light comprises applying the minority polarization pattern by an optically addressed light valve or a liquid crystal display device corresponding to the minority polarization state.

8. The method of claim 5, wherein the splitting of each of the two or more beams of light into two split beams each corresponding to the majority polarization state or the minority polarization state, respectively, comprises:

spatially stacking the two or more beams of light prior to the splitting; and splitting each of the spatially combined two or more beams of light into the two split beams each corresponding to the majority polarization state or the minority polarization state, respectively.

9. An apparatus, comprising:

two or more light sources configured to emit two or more beams of light with a first intensity, each of the two or more beams of light being polarized and having a majority polarization state and a minority polarization state;

two or more spatial light modulators each configured to apply a respective polarization pattern on the majority polarization state of each of the two or more beams of light without applying a polarization pattern on the minority polarization state of each of the two or more beams of light by directing the minority polarization of each of the two or more beams of light to a beam dump; and an optical sub-assembly configured to combine the two or more beams of light to provide a single beam of light with a second intensity.

10. The apparatus of claim 9, wherein the second intensity is greater than the first intensity.

11. The apparatus of claim 9, wherein the two or more light sources comprise at least a solid state laser or at least a semiconductor laser.

12. The apparatus of claim 9, wherein the two or more spatial light modulators comprise at least a mask or a light blocking device, and wherein the optical sub-assembly is configured to combine the two or more beams of light because of the different polarization states.

13. The apparatus of claim 9, wherein the optical sub-assembly is configured to combine the majority polarization state and the minority polarization state of the two or more beams of light because of the different polarization states, and wherein the two or more spatial light modulators comprise at least a mask or a light blocking device configured to pattern each of the two or more beams of light after the combining.

14. The apparatus of claim 9, wherein the two or more spatial light modulators comprise two or more optically addressed light valves or two or more liquid crystal display devices configured to apply the respective polarization pattern on the majority polarization state of each of the two or more beams of light.

15. The apparatus of claim 9, wherein the optical sub-assembly is further configured to perform operations comprising:

splitting each of the two or more beams of light into two split beams each corresponding to the majority polarization state or the minority polarization state, respectively;

spatially stacking the split beam of each of the two or more beams of light corresponding to the majority polarization state to provide a first beam of light corresponding to the majority polarization state;

spatially stacking the split beam of each of the two or more beams of light corresponding to the minority polarization state to provide a second beam of light corresponding to the minority polarization state; and combining the patterned first and second beams of light to provide the single beam of light.

16. The apparatus of claim 15, wherein the two or more spatial light modulators comprise:

a first optically addressed light valve or a first liquid crystal display device configured to apply a majority polarization pattern on the first beam of light; and a second optically addressed light valve or a second liquid crystal display device configured to apply a minority polarization pattern on the second beam of light.

17. The apparatus of claim 15, wherein:

in spatially stacking the split beam of each of the two or more beams of light corresponding to the majority polarization state to provide the first beam of light corresponding to the majority polarization state, the optical sub-assembly is configured to perform operations comprising:

spatially stacking, by a first set of mirrors of the optical sub-assembly, two or more split beams of the two or more beams of light corresponding to the majority polarization state; and homogenizing, by a first homogenizer of the optical sub-assembly, the spatially stacked two or more split beams to provide the first beam of light; and in spatially stacking the split beam of each of the two or more beams of light corresponding to the minority polarization state to provide the second beam of light corresponding to the minority polarization state, the optical sub-assembly is configured to perform operations comprising:

spatially stacking, by a second set of mirrors of the optical sub-assembly, two or more split beams of the two or more beams of light corresponding to the minority polarization state; and homogenizing, by a second homogenizer of the optical sub-assembly, the spatially stacked two or more split beams to provide the second beam of light.

18. The apparatus of claim 15, wherein, in splitting each of the two or more beams of light into two split beams each corresponding to the majority polarization state or the minority polarization state, respectively, the optical sub-assembly is configured to perform operations comprising:

spatially stacking, by a set of mirrors of the optical sub-assembly, the two or more beams of light prior to the splitting; and splitting, by a set of polarizers of the optical sub-assembly, each of the spatially combined two or more beams of light into the two split beams each corresponding to the majority polarization state or the minority polarization state, respectively.

* * * * *